(12) United States Patent
Cummings et al.

(10) Patent No.: US 6,864,460 B2
(45) Date of Patent: Mar. 8, 2005

(54) METHOD OF ABLATING AN OPENING IN A HARD, NON-METALLIC SUBSTRATE

(75) Inventors: Michael Cummings, Waterloo (CA); Glover Ruiz, Kitchener (CA); Cecil Archibald, Waterloo (CA)

(73) Assignee: Virtek Laser Systems, Inc., Waterloo (CA)

(*) Notice: Subject to any disclaimer, the term of this patent is extended or adjusted under 35 U.S.C. 154(b) by 284 days.

(21) Appl. No.: 10/187,881

(22) Filed: Jul. 2, 2002

(65) Prior Publication Data
US 2003/0006220 A1 Jan. 9, 2003

Related U.S. Application Data

(63) Continuation of application No. PCT/US02/21082, filed on Jul. 2, 2002.
(60) Provisional application No. 60/302,495, filed on Jul. 2, 2001.

(51) Int. Cl.[7] .................................... B23K 26/00
(52) U.S. Cl. ........................ 219/121.71; 219/121.7
(58) Field of Search ................. 219/121.71, 121.7, 219/121.67, 121.68, 121.69, 121.84, 121.85

(56) References Cited

U.S. PATENT DOCUMENTS

| | | |
|---|---|---|
| 3,410,979 A | 11/1968 | Larsson |
| 3,527,198 A | 9/1970 | Takaoka .................. 219/69 |
| 3,601,457 A | 8/1971 | Helms ................... 308/187.2 |
| 3,696,504 A | 10/1972 | Cupler, II ................ 29/558 |
| 3,742,182 A | 6/1973 | Saunders ............... 219/121 |
| 3,770,936 A | 11/1973 | Rively et al. ........... 219/121 |
| 3,885,943 A | 5/1975 | Chui ......................... 65/97 |
| 3,930,825 A | 1/1976 | Chui ......................... 65/62 |
| 3,971,910 A | 7/1976 | Marschalko et al. .... 219/121 |
| 4,323,755 A | 4/1982 | Nierenberg ............. 219/121 |
| 4,441,008 A | 4/1984 | Chan ...................... 219/121 |
| 4,544,442 A * | 10/1985 | Lassen ..................... 216/20 |
| 4,789,770 A * | 12/1988 | Kasner et al. ........ 219/121.7 |
| 4,839,497 A | 6/1989 | Sankar et al. ....... 219/121.71 |
| 4,894,115 A * | 1/1990 | Eichelberger et al. ..... 134/1.1 |
| 4,912,298 A | 3/1990 | Daniels et al. ...... 219/121.69 |
| 5,063,280 A * | 11/1991 | Inagawa et al. ...... 219/121.7 |
| 5,310,120 A | 5/1994 | Ehinger et al. ........... 239/708 |
| 5,317,661 A | 5/1994 | Szentesi et al. ........... 385/31 |
| 5,379,016 A | 1/1995 | Smith et al. ............. 338/308 |
| 5,401,973 A | 3/1995 | McKeown et al. ..... 250/492.3 |
| 5,434,420 A | 7/1995 | McKeown et al. ..... 250/396 |
| 5,451,794 A | 9/1995 | McKeown et al. ..... 250/492.3 |
| 5,489,321 A | 2/1996 | Tracy et al. ............... 65/43 |
| 5,578,229 A * | 11/1996 | Barnekov et al. .... 219/121.72 |
| 5,629,570 A | 5/1997 | Weigert ................... 307/118 |
| 5,665,134 A | 9/1997 | Kirby et al. ............... 65/61 |
| 5,757,016 A | 5/1998 | Dunn et al. ............ 250/492.1 |
| 5,894,538 A | 4/1999 | Presby .................... 385/129 |
| 5,902,368 A | 5/1999 | Witzmann et al. ........ 65/105 |
| 5,966,485 A | 10/1999 | Luther et al. ............. 385/85 |
| 5,978,189 A | 11/1999 | Habu ...................... 360/135 |
| 5,984,159 A | 11/1999 | Ostendarp et al. ....... 225/93.5 |
| 6,112,967 A | 9/2000 | Ostendarp et al. ....... 225/93.5 |
| 6,204,472 B1 | 3/2001 | Muzzi et al. .......... 219/121.67 |
| 6,211,488 B1 * | 4/2001 | Hoekstra et al. ..... 219/121.72 |
| 6,289,600 B1 | 9/2001 | Watts ....................... 33/542 |

* cited by examiner

Primary Examiner—M. Alexandra Elve
(74) Attorney, Agent, or Firm—Howard & Howard

(57) ABSTRACT

A method of ablating a hole into a hard, non-metallic substrate is disclosed. At least on laser assembly capable of generating a laser beam in an axis having a focus that is moveable relative to said axis is provided. A focus of the laser beam is positioned adjacent at least one surface of the substrate. A first layer of the substrate is ablated by the laser beam. The focus is moved relative to the axis corresponding to the depth of the substrate thereby enabling ablation of successive layers of the substrate. Successive layers of the substrate are ablated to generate a hole into the substrate.

17 Claims, 3 Drawing Sheets

METHOD OF ABLATING AN OPENING IN A HARD, NON-METALLIC SUBSTRATE

This application claims benefit of provisional application Ser. No. 60/302,495 Jul. 2, 2001 and a continuation of PCT/US 02/21802 Jul. 2, 2001.

BACKGROUND OF THE INVENTION

The present invention relates generally to a method of ablating a hole in a hard, non-metallic substrate, particularly including glass and ceramics. More specifically, the subject invention relates to ablating a hole in a hard, non-metallic substrate using at least one laser.

Drilling or ablating a hole into a hard, non-metallic substrate, such as, for example, glass has proven to be difficult and impractical in a production environmental Prior an efforts to drill holes in a hard non-metallic substrate have utilized diamond tipped drill bits. In order to drill a hole entirely through a hard, non-metallic substrate 24 without causing the edge around the hole to chip, the hole must be drilled, generally, simultaneously from two sides of the substrate. Therefore, two drill bits must be aligned precisely along the same drilling axis. Absent a precise alignment, the hole will not be property formed, and the substrate could be irreparably damaged.

A further difficulty of using opposing drill bits on two sides of the substrate is the probability of damaging the drill bits should contact be made between the two drill bits while drilling the hole. Generally, one drill will be withdrawn from the hole prior to the other drill being engaged with this substrate. However, due to production variability and the small distance between the opposing drill bits, a high probability exists hat the drill bits will make contact and the article being drilled is generally destroyed. If the drill bits become damaged, new drill bits must be installed, which is known to take several hours.

A still further drawback of using drill bits to form a hole in a hard, non-metallic substrate is the inability to form holes having various shapes. It is desirable in many industrial applications to form a hole in a hard, non-metallic substrate that has a shape other than circular, such as, for example, oval, square or other polygonal shape. Given the operational limitations of a diamond tipped drill bit, only circular holes may be drilled in a substrate.

Many glass products require holes that are presently formed by diamond tipped drill bits. These include patio furniture, tempered automotive glass, glass, mirrored electrical and outlet covers. Eye glass lenses are shaped with diamond tipped drill bits. Even glass shower doors require notches to provide space to attach hinges. Forming some of these holes is known to take upwards of 45 minutes. Further, patio furniture does not always present a smooth surface to initiate drilling, which has resulted in production problems.

Lasers have been introduced to cut and etch glass substrates recently to overcome the problems associated with diamond tipped drill bits, but with limited success. U.S. Pat. No. 6,204,472 discloses a method of cutting a hollow glass article using a $CO_2$ laser. The laser forms an incision channel in the glass substrate by vaporizing the glass. However, the depth of the channel is limited and a secondary operation is necessary to separate the hollow glass article at the channel. More specifically, the glass is heated with burners and separated with a percussion tool.

U.S. Pat. No. 5,902,368 discloses severing thin-walled glass substrates using a $CO_2$ laser to heat a particular area of the glass substrate forming a severance point. The glass substrate is then stretched and separated at the heated separation point. However, because the focal point of the laser is not adjustable relative to the glass substrate, the thickness of the glass substrate can be no more than about 0.2 mm.

U.S. Pat. No. 4,441,008 discloses a method of drilling an ultrafine hole through a glass substrate. A $CO_2$ laser is used to drill a hole by establishing a stationary focal point of the laser 0.02 to 0.08 inches below one surface of the glass. The laser is pulsed three to five times to form the hole in the glass substrate. In order to prevent cracking of the glass substrate, the glass substrate is heated to a temperature of between 500° and 1,040° F. prior to activating the laser.

None of the prior art discussed above discloses a method of drilling holes in glass substrates that is practical and cost efficient in a production environment. The underlying drawback of each of these laser devices is the inability to change the focal point of the laser relative to the glass substrate. Therefore, additional steps are necessarily added to the process in order to prevent the substrate from being damaged by the laser. Accordingly, it would be desirable to provide a laser device and ablating method that would enable ablating a hole into a hard, non-metallic substrate by moving the focal point of the laser relative to the depth of the substrate.

SUMMARY OF THE INVENTION AND ADVANTAGES

A method of ablating a hole in a hard, non-metallic substrate, particularly including, but not limited to glass and non-metallic substrates, with a laser is disclosed. At least one laser assembly is provided that is capable of generating a laser beam having a movable focus. The focus is movable relative to the hard, non-metallic substrate along a length, width and depth of the substrate. The laser is activated generating the laser beam. The laser is focused to provide a focus of the laser beam adjacent at least one surface of the hard, non-metallic substrate. A first layer of the substrate is ablated in a configured pattern from at least one surface of the hard, non-metallic substrate. The focus is moved relative to an axis corresponding to the depth of the substrate to enable ablation of successive layers of the substrate. Successive layers of the substrate are ablated by successively moving the focus deeper into the substrate to venerate a hole into the substrate.

The present method of ablating a hole in a hard, non-metallic substrate solves the problems associated with the prior art methods by providing the step of moving the focus of the laser relative to the depth of the substrate. Further prior art methods of ablating glass substrates do not include a focus movable relative to the depth of the substrate. Therefore, an additional step is required to prevent damaging the substrate.

While the reasons why the method set forth above results in successfully ablating a hole into a hard, non-metallic substrate is not fully understood, one theory is based upon adjusting the focus of the laser incrementally deeper into the substrate. By refocusing the laser to establish a focus incrementally deeper into the substrate, successive layers of the substrate can be ablated in order to prevent damaging the substrate with the laser beam. Further, configured patterns may be ablated into the substrate by moving the focus along the length and width of the substrate as well as the depth. Therefore, predetermined configurations of holes may be ablated into the substrate, which is not possible unless the focus is movable relative to the depth, width and length of the substrate.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE INVENTION

Figure 1:
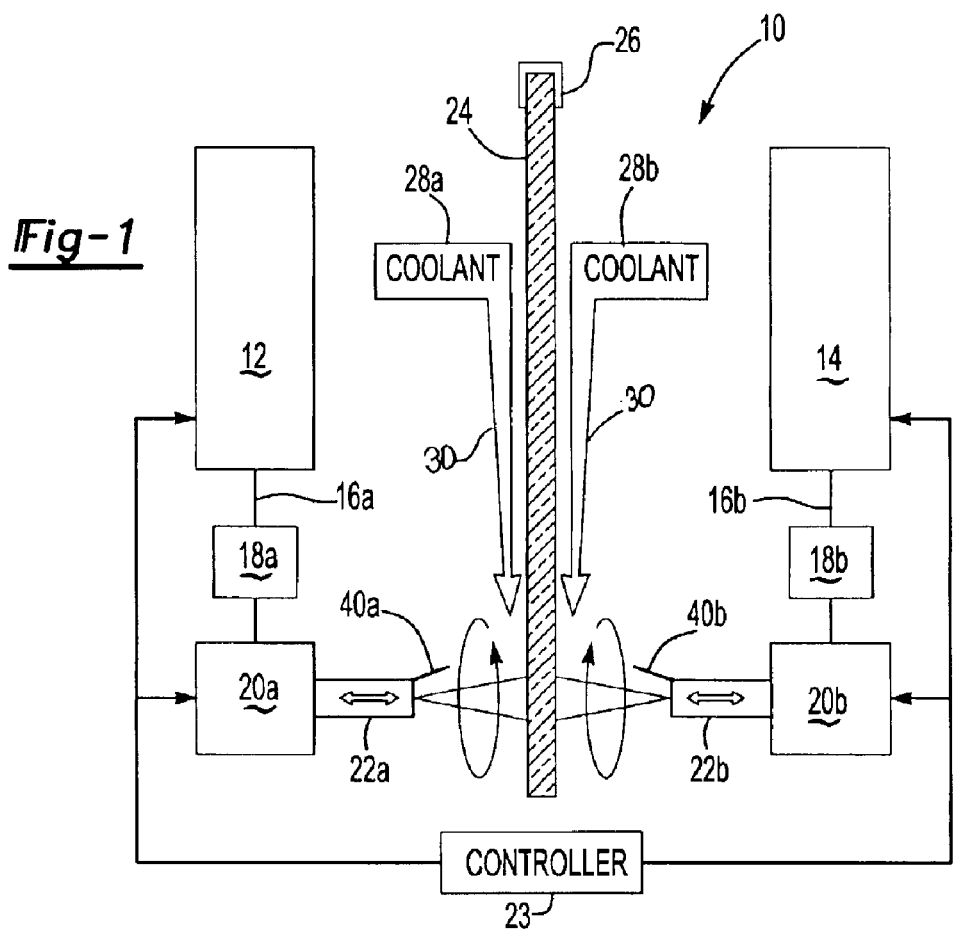
FIG. 1 is a schematic of the laser apparatus of the subject invention.

Referring to FIG. 1, a schematic view of the laser ablating apparatus used for the method of the present invention is generally shown at 10. A first $CO_2$ laser 12 and a second $CO_2$ laser 14 each generate a laser beam 16a, 16b preferably having a wavelength of generally 10.6 $\mu$m capable of ablating a hard, non-metallic substrate 24, particularly including glass and ceramics. The laser beam 16a, 16b is directed through a first set of optics 18A, 18B and into a galvanometer 20a, 20b. Each galvanometer 20a, 20b refocuses the laser beam 16a, 16b through a z axis lens 22a, 22b and redirects the laser beam 16a, 16b toward opposing sides of the hard, non-metallic substrate 24. Therefore, the substrate 24 is ablated on opposite sides. Alternatively, a single laser may be used for ablating a single side of the substrate 24.

Each laser 12, 14 and each galvanometer 20a, 20b is directed by a controller 25 in order to coordinate ablating of the substrate 24 as will be explained further below. Preferably, the hard, non-metallic substrate 24 is supported by a gantry 26 or equivalent support device. A cooling apparatus 28A, 28B positioned on each side of the substrate 24 directs a coolant 30 onto the substrate 24 adjacent the area of the substrate 24 being ablated by the laser beam 16a, 16b. The coolant 30 may be liquid or gaseous and dissipates the heat generated by the laser to prevent the substrate 24 from cracking. Water has proven to be the most effective coolant to dissipate heat generated by the laser. An additional advantage to using water as a coolant is the water's filtering characteristics. Unlike a gaseous coolant, water absorbs gaseous by-products resulting from the ablating process. The by-products absorbed by the water may be filtered for waste removal or the water may be disposed of in an environmentally sound manner if necessary.

Each laser 12, 14 preferably generates a wavelength of about 10.6 $\mu$m and is operated at between 75 and 150 watts. More preferably, each laser 12, 14 generates an output of about 100 watts. However, the desired energy level is optimized according to the substrate 24 being ablated. 100 kw has proven to be most effective to ablate several types of glass. It is believed that tempered glass may require slightly more energy (and density) than regular glass. An energy level should be chosen that is known to be absorbed by the glass (or other clear substrate) in order to transfer the energy from the laser beam to the glass. Otherwise, the laser beam will travel through the glass. A suitable water-cooled $CO_2$ laser for the method of this invention is a Model No. LC100NV of DEOS, Maria ElectroOptics Systems, Inc. of Bloomfield, Conn., now a division of Coherent. An air-cooled or equivalent laser is also suitable to practice the method of this invention. The $CO_2$ laser 12, 14 is preferred to practice the method of this invention because a laser beam is generated (hat includes the energy level and wavelength that is absorbed by hard, non-metallic substrates 24, such as, for example glass and ceramics, and tempered glass. Other types of lasers generate laser beams having different wavelengths and power outputs are known to transmit through glass thereby preventing the ablation of a glass substrate 24.

In order to ablate the hard, non-metallic substrate 24, a galvanometer capable of generating a laser focus moveable in the x, y and z axes is preferable where x and y correspond to the length and width of the substrate 24 and z corresponds to the depth. A suitable galvanometer capable of moving the focus in this manner is available from SCAN Lab AG of Puchhein, Germany, Model "Hurry SCAN" with a "Vario SCAN" built in as part of the galvanometer system to provide movement along the z axis. The thickness of the substrate 24 that may be ablated is determined by the extent of movement along the z axes of the focus of the laser. Presently, galvanometers capable of moving the focus along the z axes are able to move the focus a distance of about 1.6 cm. Therefore, the thickness of the hard, non-metallic substrate 24, which is sufficient for many applications, being ablated can presently be no more than about 3.2 cm, absent moving the glass relative to the lasers 12, 14. Until galvanometer technology capable of moving the focus along the z axis becomes more adaptable, it is necessary to move the hard, non-metallic substrate 24 in the z axis in order to ablate a depth of more than about 3.2 cm.

Figure 2A:
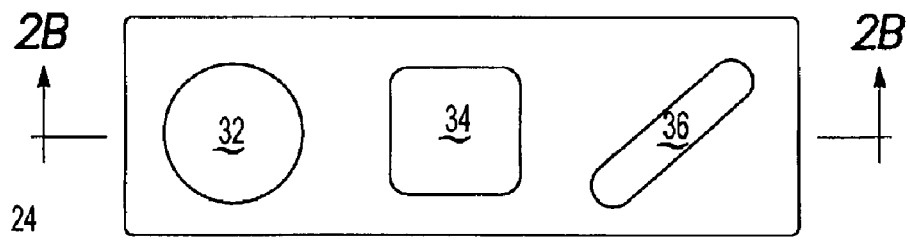
FIG. 2A is sectional view of holes ablated into the hard, nonmetallic substrate though line 2B—2B of FIG. 2A.
Figure 2B:
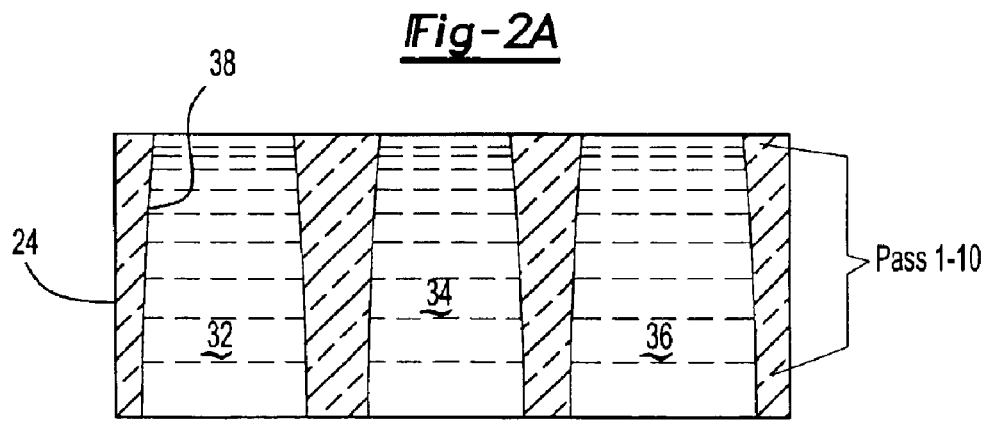
FIG. 2 is top view of various shaped holes ablated into a hard, non-metallic substrate.

As shown in FIGS. 2A and 2B, a galvanometer capable of moving a focus of the laser along the x, y and z axes can ablate an opening into the hard, non-metallic substrate 24 having various configurations. As stated above, the x and y axes are correlated to the length and width of the substrate 24, and the z axis is correlated to the depth of a substrate 24. In order to prevent damaging the substrate 24, the depth of the focus in the z direction is continuously increased as layers of the substrate 24 are ablated FIG. 2B shows a typical scenario where up to 10 passes of the laser are made to ablate successive layers of the substrate 24 in order to form a hole into one side of the substrate 24. A circular hole 32 is shown having a width of about 4.0 cm. It is believed that holes having a diameter of up to 8 cm can be ablated into the substrate 24 with presently available galvanometer 20a, 20b technology. In order to ablate holes having a greater diameter, the substrate 24 may be moved relative to the galvanometers. A square hole 34 is formed in the same manner as the circular hole 32. Preferably, the corners of any square or polygonal hole formed in the substrate 24 will have radiused corners in order to prevent stress points being formed in the substrate 24. Also shown in FIG. 2 is an oval hole 36 having tight radiuses in order to prevent forming stress points in the substrate 24.

As shown in FIG. 2, each successive pass of the laser is preferably moved at a greater depth into the substrate than the prior pass. A slightly concave surface 38 is formed along a wall of the various holes 32, 34, 36 into the substrate 24. For the purpose of this application, a hole may be defined as any aperture either partially or entirely through the substrate 24, a generally three-sided notch on the edge of the substrate 24, an etching partially into the substrate 24, and any groove ablated into the substrate 24. In order to ablate large diameter openings in the substrate 26, the laser is moved about the circumference of the hole 32, 34, 36 along each pass. Because the laser beam 16a, 16b is generated at the z axis, which is central to the hole 32, 34, 36, the larger the diameter of the hole, yields a greater radius of a convex wall 38. As should be understood by those of skill in the art, by ablating the circumference of a desired hole a "plug" of substrate 24 remains inside the hole. When the laser beam 16a, 16b passes completely through the substrate 26, the coolant 30, through impingement, forces the "plug" from the hole 32, 34, 36.

Figure 3A:
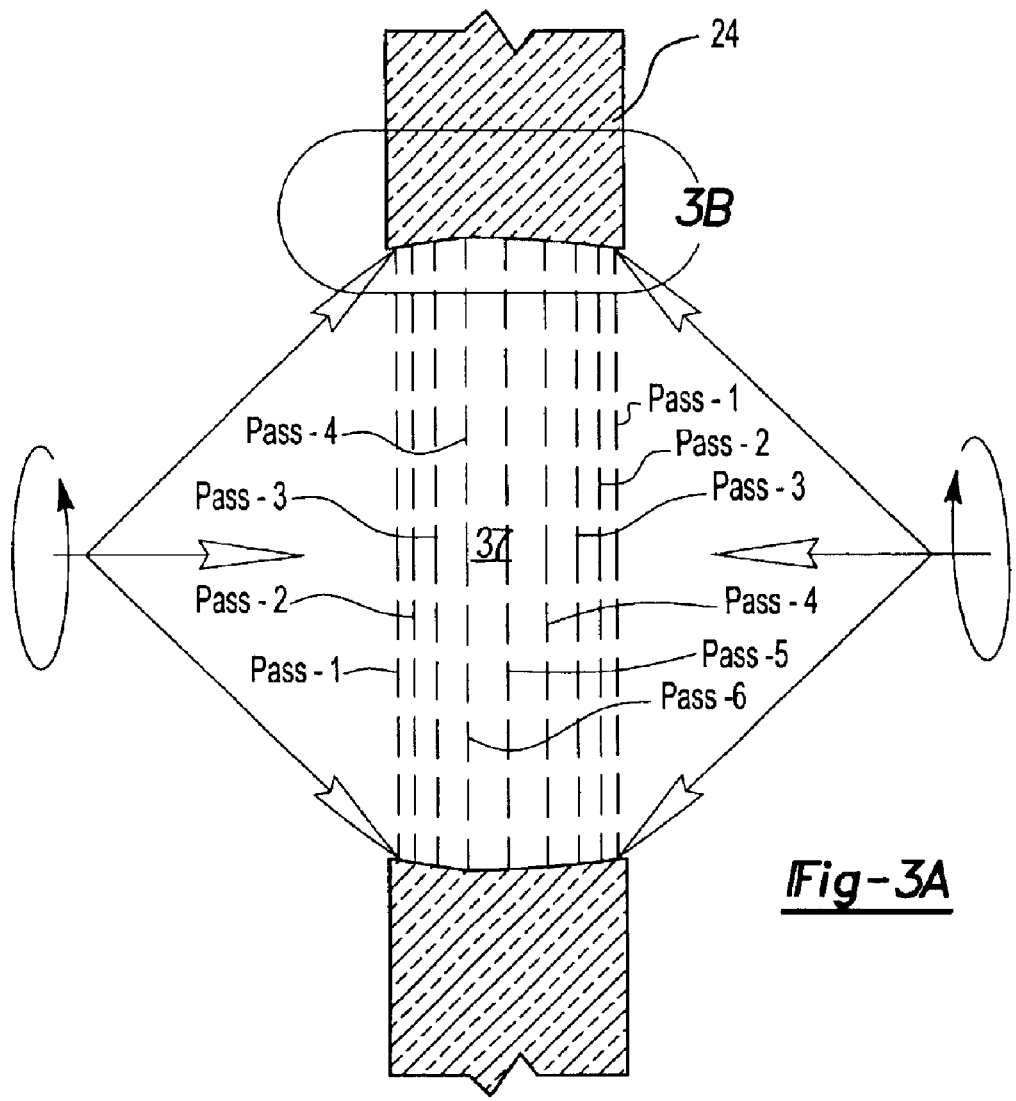
FIG. 3A is an illustrative view of the inventive laser ablating process.

Referring to FIG. 3A, a schematic of a hole 37 ablated entirely through the hard, non-metallic substrate 26 is shown. The hole 37 is ablated from opposing sides of the substrate 26. The laser beam 16a, 16b travels around the circumference of the hole as directed by the controller 25 (FIG. 1). The controller 25 also adjusts the galvanometers 20a, 20b to align the laser beams 16a, 16b along a common z axis. Therefore, the laser beam 16a generated by the first laser 12 points through the z axis optics 22a directly opposite the laser beam 16b generated by the second laser 14 through the z axis optics 22b. Therefore, if each laser were to continuously operate until a hole 37 is ablated completely through the substrate 24, the z axis optics 22a, 22b would be damaged by the opposing laser beam 16b, 16a. Therefore, it is preferable that one laser beam 16a, 16b ablates a depth greater than the other laser beam 16b, 16a by making additional passes. A shutter 40a, 40b (FIG. 1) closes over the z axis optics 22a, 22b on the laser that terminates emission first in order to prevent the opposing laser from damaging its z axis optics 22a, 22b.

As represented in FIG. 3A, the first laser beam 16a completes the four passes along the circumference of the hole 37 after which, the shutter 40 closes. Either concurrently or subsequently to the four passes made by the first laser beam 16a, the second laser beam 16b makes six passes along the circumference of the hole 37 until the hole 37 is ablated completely through the substrate 24. Any number of passes may be completed by each of the laser beams 16a, 16b in order to ablate the hole 37 completely through the substrate 24 as long as one laser beam 16a, 16b terminates emission prior to the other laser beams 16b, 16a in order to prevent damage to the z axis optics 22a, 22b. In other words, one laser beam preferably ablates up to about 51% of the depth of the substrate 24 while the other laser beam ablates only about 49% of the depth of the substrate 24.

Figure 3B:
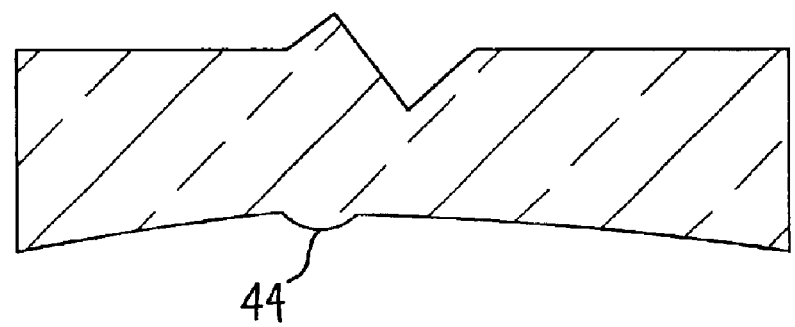
FIG. 3B is a partial sectional view of a wall defining the hole in the hard non-metallic substrate.

By ablating a hole into a hard, non-metallic substrate 24 from opposing sides of the substrate 24, a variety of benefits are derived that are not realized by ablating only one side of the substrate 24. For example, it should be understood by those of skill in the art, sharp edges formed in a hard, non-metallic substrate 24, such as, for example glass, causes stress points in the glass which could result in cracking. Therefore, it is preferable to ablate the substrate 24 from opposing sides of the substrate 24. During the first pass made by each laser beam 16a, 16b a groove is formed in the surface of the substrate 24 initiating a smooth and rounded edge circumscribing the hole 37 being formed in the substrate 24. Therefore, the final pass required to ablate completely through the substrate 24 is made generally mid way through the substrate 24. The final pass of the laser beam that ablates through the substrate 24 leaves a rough inconsistent surface as shown in FIG. 3B. It is believed that this rough inconsistent surface will not adversely affect the stability of the hard, non-metallic substrate 24 because it is not located at an edge of the substrate 24.

In order to ablate a smooth hole into the substrate 24, the parameters of the lasers 12, 14 are predetermined by the controller 23. The parameters of each laser 12, 14 are preprogrammed into the controller 23 according to the type of hole being ablated into the substrate 24 and the type of hard, non-metallic substrate 24 being ablated. Different types of substrates 24 require different laser 12, 14 settings in order to prevent cracking or otherwise damaging the substrate 24. The most important laser parameters preprogrammed into the controller 23 are the laser power, the galvanometer speed, the laser frequency (pulse rate), and the pulse with modulation of the laser. Each of these parameters are tuned in to generate a power density adjacent the surface of the substrate 24 of generally between 40 and 50 kw/cm$^2$. More preferably, a power density of generally 45 kw/cm$^2$ is generated. Power densities in this range are believed to be significantly higher than power densities generated in the prior art references cited in the Background section of this application. Although not fully understood, it is believed that the high power density of the laser beam in combination with a focus moveable along the z axis of the substrate 24 may play a role in the successful ablation of the substrate 24 absent additional steps such as, for example heating the substrate 24 to a high temperature.

Figure 4:
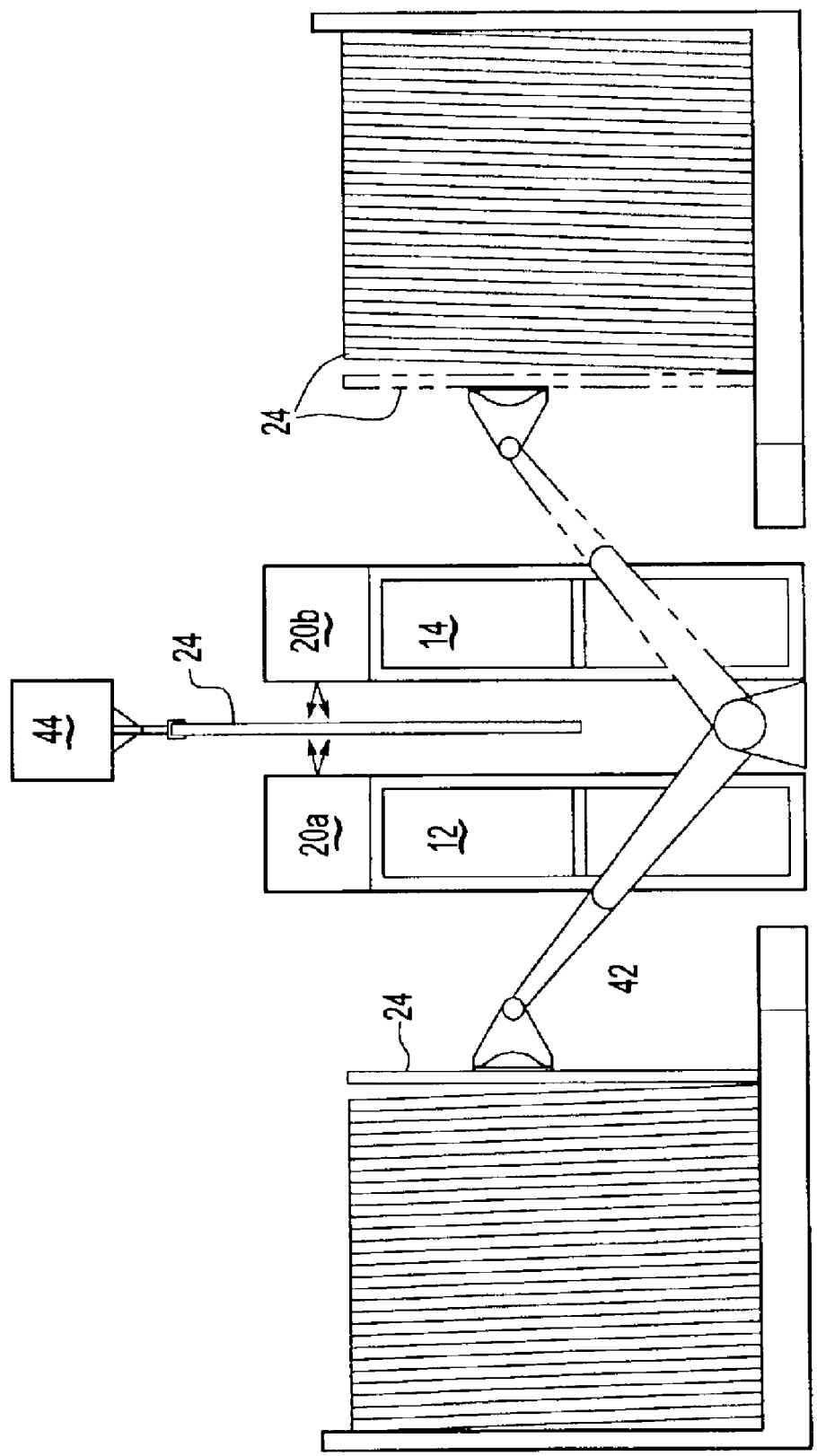
FIG. 4 is a top view of the preferred embodiment of laser drilling apparatus.

FIG. 4 shows a possible production configuration of the inventive method. A first robot arm 42 grasps the substrate 24 and positions the substrate 24 between the lasers 12, 14 into a gantry 44 or equivalent fixture. Alternatively, robot arm 42 may include a gripper (not shown) for supporting the substrate 24 during processing. The controller 23 is signaled that the substrate 24 is in position to be ablated by a sensor (not shown). The controller 23 then signals the lasers 12, 14 to begin the ablating operation. Additionally, the controller 23 signals the lasers 12, 14 with the substrate 24 type, power settings, galvanometer speed, hole size, hole shape, hole location, depth of penetration, focus adjustments, and glass thickness each correlating to the type of substrate 24 and a type of hole being drilled in the substrate 24.

The controller signals the galvanometers 20a, 20b to control the focus of the laser along the x, y and z axes. As stated above, the x and y axes correlating to the length and width of the substrate 24, and the z axis correlates to the depth of the substrate 24. Further, several holes can be ablated into the substrate 24 at different locations of the substrate 24 relative to the galvanometers 20a, 20b by moving the substrate 24 relative to the lasers 12, 14. The substrate 24 may also be moved along the z axis if the thickness of the substrate 24 is greater than about 3.2 cm. All the movements of the substrate 24 are also directed by the controller 23 according to the preprogramming sequence.

It may be desirable to ablate a hole only partially through the substrate 24 in order to etch the substrate 24 with a figure. Therefore, the controller is also programmable with graphics information enabling the lasers 12, 14 to ablate figures, such as designs, digits, letters, and bar codes into the substrate 24. Figures may be etched into the substrate 24 by activating either both 12, 14 or one 12 of the lasers. By activating both of the lasers 12, 14, a three-dimensional figure may be etched into the substrate 24.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. An apparatus for ablating a hole through a hard, nonmetallic workpiece comprising:

a first laser assembly having a first galvanometer and a second laser assembly having a second galvanometer;

said first laser assembly having a first optical lens for focusing a first laser beam emitted from said first laser assembly and said second laser assembly having a second optical lens for focusing a second laser beam emitted from said second laser assembly coincident with said first laser beam; and a controller first focusing said first and second laser beams on opposed surfaces of said hard, non-metallic workpiece to ablate first layers of said hard metallic workpiece at said opposed surfaces, said controller then refocusing said first and second laser beams in a Z axis to ablate second layers of said hard metallic workpiece adjacent said first layers, and said controller continuing to refocus said laser beams to ablate successive layers of said hard metallic workpiece in said Z axis, thereby forming said hole through said hard, non-metallic workpiece.

2. An apparatus as set forth in claim 1 wherein said first and second galvanometer focus said first and second laser beam along axes correlating to the length, width, and depth of said workpiece.

3. An apparatus as set forth in claim 1 further including a controller electronically connected to said first and second laser assemblies and being programmable for directing the ablating rate of said laser beams.

4. An apparatus as set forth in claim 1 further including a cooling apparatus capable of providing a coolant to the workpiece thereby dissipating heat generated by said laser beams on said workpiece.

5. An apparatus as set forth in claim 1 wherein said first and said second laser assembly each include a $CO_2$ laser.

6. An assembly as set forth in claim 1 wherein said first and second laser generate a poser density of between generally 40 and 50 $Kw/cm^2$.

7. An assembly as set forth in claim 1 wherein said first and second laser generate a poser density of generally 45 $Kw/cm^2$.

8. A method of ablating a configured opening in a clear, hard, non-metallic substrate, comprising the following steps:

(a) focusing a first laser on one surface of said clear, hard, non-metallic substrate to ablate said one surface and form an opening in said one surface;

(b) focusing a second laser on an opposed surface of said clear, hard, non-metallic substrate to ablate said opposed surface and form an opening in said opposed surface;

(c) moving said focus of said first and second lasers relative to a Z axis corresponding to a depth of said hard, non-metallic substrate; and (d) repeating steps (b) and (c) to form a configured openings in said clear, hard, non-metallic substrate having a predetermined depth.

9. The method of ablating a configured opening in a hard, non-metallic substrate as defined in claim 8, wherein said method includes flushing said opening with a liquid coolant to prevent cracking of said hard, non-metallic substrate.

10. The method of ablating a configured opening in a hard, non-metallic substrate as defined in claim 9, wherein said method includes flushing said opening with water.

11. The method of ablating a configured opening in a hard, non-metallic substrate as defined in claim 8, wherein said method includes moving said focus of said one laser in a polygonal pattern in said x and y axes to generate a polygonal opening in said hard, non-metallic substrate.

12. A method of ablating an opening through a clear, hard, non-metallic substrate, comprising the following steps:

(a) focusing a first laser on a first surface of said clear, hard, non-metallic substrate thereby ablating a first layer of said first surface of said clear, hard, non-metallic substrate;

(b) simultaneously focusing a second laser on a second surface of said clear, hard, non-metallic substrate opposite said first surface and coincident with said first laser, thereby ablating a second layer of said clear, hard, non-metallic substrate;

(c) moving a focus of said first and second lasers relative to a z axis corresponding to a depth of said clear, hard, non-metallic substrate to ablate successive layers of said substrate; and (d) repeating step (c) until an opening is ablated through said substrate.

13. The method of ablating an opening through a clear, hard, non-metallic substrate as defined in claim 12, wherein said method includes moving said focus of said first and second lasers in x and y axes corresponding to a length and width of said surface to ablate a configured opening through said clear, hard, non-metallic substrate.

14. The method of ablating an opening through a clear, hard, non-metallic substrate as defined in claim 13, wherein said method includes flushing said openings in said clear, hard, non-metallic substrate with water.

15. The method of ablating an opening through a clear, hard, non-metallic substrate as defined in claim 12, wherein said method includes moving said focus of said first and second lasers in x and y axes corresponding to a length and width of said surfaces in a polygonal pattern, thereby forming a polygonal opening through said clear, hard, non-metallic substrate.

16. The method of ablating an opening through a clear, hard, non-metallic substrate as defined in claim 12, wherein said method includes terminating one of said first and second lasers before an opening is ablated through said clear, hard, non-metallic substrate and continuing the other of said first and second lasers until an opening is ablated through said clear, hard, non-metallic substrate.

17. The method of ablating an opening through a clear, hard, non-metallic substrate as defined in claim 16, wherein said method includes shuttering said one of said first and second lasers upon termination of said one of said first and second lasers.

* * * * *